United States Patent
Hung et al.

(10) Patent No.: US 9,318,609 B2
(45) Date of Patent: Apr. 19, 2016

(54) SEMICONDUCTOR DEVICE WITH EPITAXIAL STRUCTURE

(71) Applicant: UNITED MICROELECTRONICS CORP., Hsin-Chu (TW)

(72) Inventors: Yu-Hsiang Hung, Tainan (TW); Ssu-I Fu, Kaohsiung (TW); Chung-Fu Chang, Tainan (TW); Cheng-Guo Chen, Changhua County (TW); Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/620,209

(22) Filed: Feb. 12, 2015

(65) Prior Publication Data
US 2015/0155386 A1  Jun. 4, 2015

Related U.S. Application Data

(62) Division of application No. 13/913,511, filed on Jun. 9, 2013, now Pat. No. 8,993,384.

(51) Int. Cl.
| | | |
|---|---|---|
| *H01L 27/01* | (2006.01) | |
| *H01L 29/78* | (2006.01) | |
| *H01L 29/66* | (2006.01) | |
| *H01L 21/8234* | (2006.01) | |
| *H01L 21/84* | (2006.01) | |
| *H01L 27/12* | (2006.01) | |
| *H01L 29/06* | (2006.01) | |
| *H01L 29/161* | (2006.01) | |

(52) U.S. Cl.
CPC ........ *H01L 29/7851* (2013.01); *H01L 21/8234* (2013.01); *H01L 21/845* (2013.01); *H01L 27/1211* (2013.01); *H01L 29/0653* (2013.01); *H01L 29/161* (2013.01); *H01L 29/6681* (2013.01); *H01L 29/66795* (2013.01); *H01L 29/7848* (2013.01); *H01L 29/7855* (2013.01)

(58) Field of Classification Search
CPC ............. H01L 21/8234; H01L 21/845; H01L 21/823821; H01L 27/1211; H01L 29/7851; H01L 29/0653; H01L 29/161; H01L 29/66795; H01L 29/6681; H01L 29/7848; H01L 29/7855
USPC ......................... 257/347, 351, 369, 327, 344
See application file for complete search history.

(56) References Cited

U.S. PATENT DOCUMENTS

| | | |
|---|---|---|
| 6,043,138 A | 3/2000 | Ibok |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |

(Continued)

*Primary Examiner* — Kevin M Picardat
(74) *Attorney, Agent, or Firm* — Winston Hsu; Scott Margo

(57) ABSTRACT

A semiconductor device includes a fin structure, an isolation structure, a gate structure and an epitaxial structure. The fin structure protrudes from the surface of the substrate and includes a top surface and two sidewalls. The isolation structure surrounds the fin structure. The gate structure overlays the top surface and the two sidewalls of a portion of the fin structure, and covers a portion of the isolation structure. The isolation structure under the gate structure has a first top surface, and the isolation structure at two sides of the gate structure has a second top surface. The first top surface is higher than the second top surface. The epitaxial layer is disposed at one side of the gate structure and is in direct contact with the fin structure.

10 Claims, 6 Drawing Sheets

(56) References Cited

U.S. PATENT DOCUMENTS

| | | |
|---|---|---|
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,525,160 B2 | 4/2009 | Kavalieros |
| 7,531,437 B2 | 5/2009 | Brask |
| 7,569,857 B2 | 8/2009 | Simon |
| 8,765,533 B2 | 7/2014 | Hsieh |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2012/0193713 A1 | 8/2012 | Kulkarni |

SEMICONDUCTOR DEVICE WITH EPITAXIAL STRUCTURE

CROSS REFERENCE TO RELATED APPLICATIONS

This application is a division of U.S. application Ser. No. 13/913,511, filed on Jun. 9, 2013, the disclosure of which is hereby incorporated herein by reference in its entirety.

BACKGROUND OF THE INVENTION

1. Field of the Invention

The present invention relates generally to the field of semiconductor devices, and more particularly to a semiconductor device with an epitaxial structure.

2. Description of the Prior Art

As semiconductor devices switching speeds continue to increase and operating voltage levels continue to decrease, the performances of metal-oxide-semiconductor filed effect transistors (MOSFETs) and other types of transistors, such as bipolar junction transistors, need to be correspondingly improved. Currently, along with the development of the MOSFETs, one of the main goals in the industry is to increase the carrier mobility so as to further increase the operation speed of the MOSFETs.

In order to improve the device performances, crystal strain technology has been developed. Crystal strain technology is becoming more and more attractive as a means for getting better performances in the field of MOS transistor fabrication. Putting a strain on a semiconductor crystal alters the speed at which charges move through that crystal. Strains make the MOS transistors work better by enabling charge carriers, such as electrons or holes, to pass through the silicon lattice of the channel more easily. Currently, attempts have been made to use a strained silicon layer as a part of MOS transistors in which an epitaxial silicon germanium (SiGe) structure or an epitaxial silicon carbide (SiC) structure is formed. In this type of MOS transistor, a biaxial tensile strain is induced in the epitaxy silicon layer due to the difference in lattice constants between SiGe or SiC and Si. As a result, the band structure is altered, and the carrier mobility is increased.

However, due to the continuous shrinkage in the size of the semiconductor devices, the aspect ratio of the epitaxial layer also gets higher, which often incur unwanted defects, such as void defects in the epitaxial layer. These defects inside the epitaxial layer reduce the stress required to be imposed onto the corresponding channel region. As a result, how to prevent the formation of the defects inside the epitaxial layer is an important issue.

SUMMARY OF THE INVENTION

To this end, on object of the present invention is to provide a semiconductor device with an epitaxial layer so that stress imposed on the channel region can be increased.

According to a preferred embodiment of the invention, a semiconductor device is provided. The semiconductor device includes a fin structure, an isolation structure, a gate structure and an epitaxial structure. The fin structure protrudes from the surface of the substrate and includes a top surface and two sidewalls. The isolation structure surrounds the fin structure. The gate structure overlays the top surface and the two sidewalls of a portion of the fin structure, and covers a portion of the isolation structure. The isolation structure under the gate structure has a first top surface and the isolation structure at two sides of the gate structure has a second top surface, wherein the first top surface is higher than the second top surface. The epitaxial layer is disposed at one side of the gate structure and is indirect contact with the fin structure.

One feature of the present invention is to provide a semiconductor device with an epitaxial layer and a fabrication method thereof. Since the process for etching the isolation structure is optionally carried out prior to and/or after the formation of the recess, the height of the isolation structure at two sides of the gate structure may be reduced. In this way, the epitaxial layer may be filled into the corresponding recess easily during the epitaxial growth process. Furthermore, since the epitaxial structure is not sealed during the epitaxial growth process, the void defects may be also avoided as a result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams showing a fabrication method of a semiconductor device according to a preferred embodiment of the present invention, wherein:

FIG. 1 is a schematic perspective diagram showing the semiconductor device at the beginning of the fabrication process;

FIG. 2 is a schematic perspective diagram showing the semiconductor device after the formation of a gate structure;

FIG. 3 is a schematic perspective diagram showing the semiconductor device after the formation of a spacer;

FIG. 4 is a schematic cross-sectional diagram taken along a line A-A' in FIG. 3;

FIG. 5 is a schematic perspective diagram showing the semiconductor device after etching the isolation structure;

FIG. 6 is a schematic perspective diagram showing the semiconductor device after etching fin structures;

FIG. 7 is a schematic cross-sectional diagram taken along a line A-A' in FIG. 6;

FIG. 8 is a schematic cross-sectional diagram taken along a line B-B' in FIG. 6;

FIG. 9 is a schematic perspective diagram showing the semiconductor device after the formation of an epitaxial layer;

FIG. 10 is a schematic cross-sectional diagram taken along a line A-A' in FIG. 9; and FIG. 11 is a schematic cross-sectional diagram taken along a line B-B' in FIG. 9.

DETAILED DESCRIPTION

Figure 1:
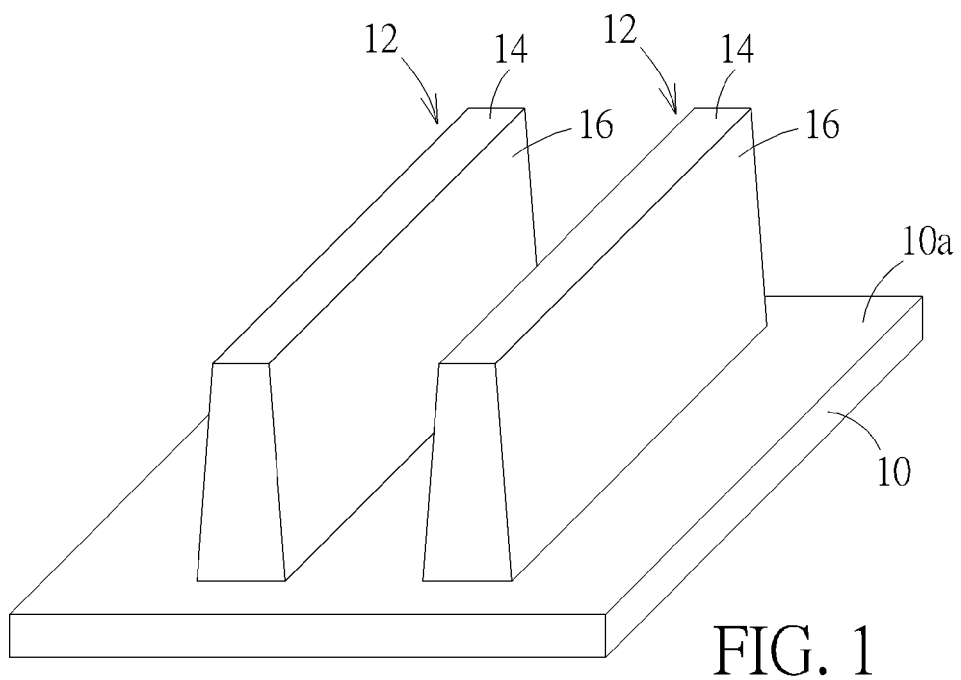

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 to FIG. 11 are schematic diagrams showing a fabrication method of a semiconductor device according to a preferred embodiment of the present invention. Please refer to FIG. 1. FIG. 1 is a schematic perspective view showing the semiconductor device of at the beginning of the fabrication process. As shown in FIG. 1, a substrate 10 is provided. The substrate 10 may be a semiconductor substrate such as a silicon substrate, a silicon containing substrate, a III-V semiconductor-on-silicon (such as GaAs-on-silicon) substrate, or a graphene-on-silicon substrate. Preferably, the substrate 10 is not a silicon-on-insulator (SOI) substrate. Still referring to FIG. 1, a plurality of fin structures 12 is disposed on the substrate 10. More precisely, the method for fabricating the fin structures 12 may include the following processes, but not limited thereto. First, a bulk substrate (not shown) is provided and a hard mask layer (not shown) is formed thereon. The hard mask layer is then patterned to define the location for forming fin structures 12 in the bulk substrate. Afterwards, an etching process is performed to form fin structures 12 in the bulk substrate. After the above processes, the fabrication method for the fin structures 12 is complete. In this case, the fin structures 12 may be regarded as protruding from the surface 10a of the substrate and the compositions of the fin structures 12 and the substrate 10 may be the same, such as epitaxial silicon. In another case, when the substrate is chosen from a III-V semiconductor-on-silicon substrate rather than the above-mentioned bulk substrate, the main compositions of the fin structures may differ from that of the underlying substrate.

In this embodiment, the hard mask layer (not shown) is optionally removed in a later process after the formation of the fin structures 12, so that a tri-gate MOSFET can be formed in the following processes. There are three contact faces between each fin structure 12 and the following formed dielectric layer serving as a carrier channel region. Compared with planar MOSFETs, the tri-gate MOSFETs have wider channel width within the same channel length. When a driving voltage is applied, the tri-gate MOSFET may produce an on-current twice higher than conventional planar MOSFETs. In another embodiment, the hard mask layer (not shown) is reserved to form a fin field effect transistor (Fin FET), which is another kind of multi-gate MOSFET. Since the hard mask layer is reserved in the fin field effect transistor, there are only two contact surfaces between each fin structure 12 and the following formed dielectric layer.

Figure 2:
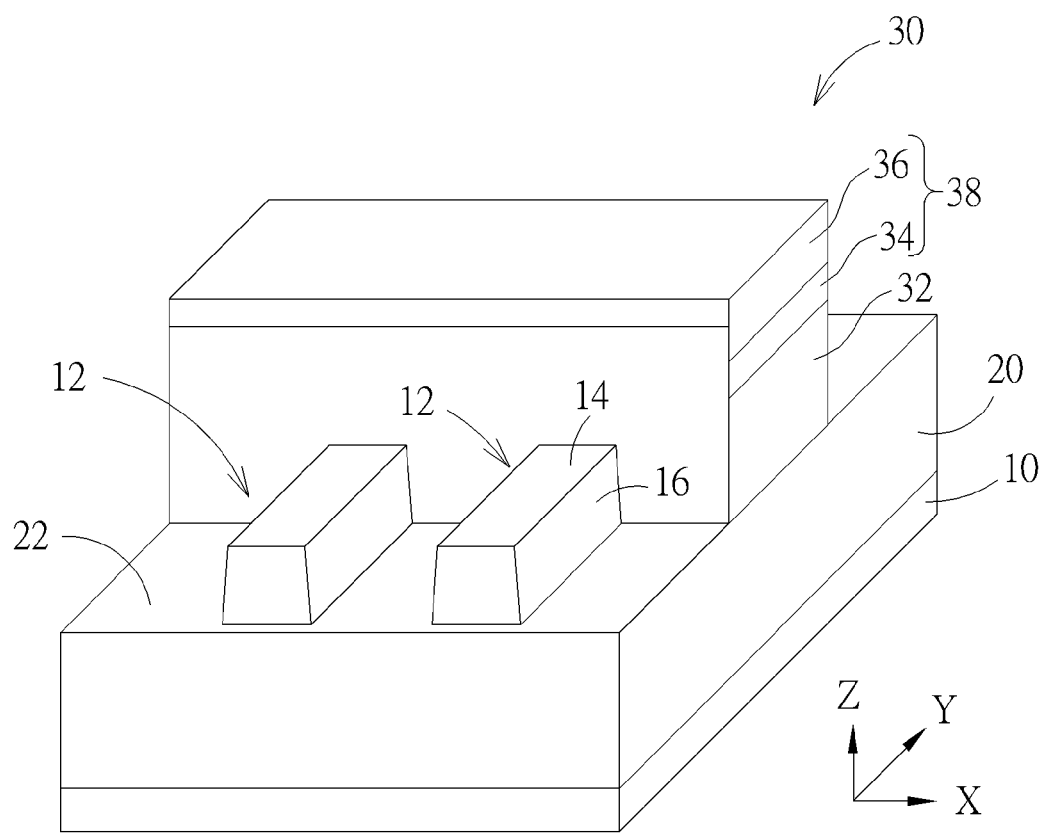

Please refer to FIG. 2. FIG. 2 is a schematic perspective diagram showing the semiconductor device after the formation of a dummy gate structure. An isolation structure 10 is formed on the substrate 10 between each fin structure 12 so as to electrically isolate subsequently-formed transistors from one another. The isolation structure 20 may have the configuration shown in FIG. 2. At this stage, a lower portion of each fin structure 12 is embedded in the isolation structure 20 and each fin structure 12 exposed out of the isolation structure 20 may have a first height H1. The isolation structure 10, for example, may be a shallow trench isolation (STI) structure, which may be formed through a STI fabrication process. Since the fabrication process for the STI structure is well-known to those skilled in the art, the detailed description of this is therefore omitted, and is not limited thereto.

Still referring to FIG. 2, in a following step, a gate dielectric layer (not shown), a sacrificial electrode layer (not shown) and a cap layer (not shown) are sequentially formed to cover the substrate 10 and the fin structures 12. Then, the gate dielectric layer, the sacrificial electrode layer and the cap layer are patterned to form a stack structure. The stack structure may be regarded as a gate structure 30 including the gate dielectric layer (not shown), the sacrificial electrode layer 32 and the cap layer 38. The gate structure 30 crosses over two fin structures 12 and covers the isolation structure 20 between them. Specifically, the gate structure 30 may cover a top surface 14 and two side surfaces 16 of portions of each fin structure 12, and may cover a top surface 22 of portions of the isolation structure 20. Additionally, the gate structure 30 is preferably aligned with a first direction X, while the fin structures 12 are preferably aligned with a second direction Y and protruding from the substrate 10 along a third direction X. In this embodiment, the first direction X, the second direction Y, and the third direction Z are mutually orthogonal to one another, but not limited thereto.

For the sake of clarity, only one gate structure 30 is depicted in FIG. 2 to FIG. 11. The number of which, however, may be increased depending on the requirements for different products. For example, more than one mutually parallel gate structure may be disposed on the substrate so that one fin structure may be concurrently covered by more than one gate structure. Besides, the same one gate structure is preferably used as a gate for transistors with the same conductivity type, like gates for PMOS transistors or gates for NMOS transistors.

In this embodiment, a gate-last for high-k last process is used so that the gate structure 30 may be regarded as a dummy gate structure. In other words, the gate dielectric layer will be replaced with a gate dielectric layer having a high dielectric constant in later processes and the sacrificial electrode layer 32 will be replaced with a conductive metal layer. Therefore, the material of the gate dielectric layer may be just a sacrificial material suitable for being removed in later processes. The sacrificial electrode layer 32 may be made of polysilicon, but it is not limited thereto. The cap layer 36 may be a single-layered or a multi-layered structure composed of a nitride layer or an oxide layer used to serve as a patterned hard mask. In this embodiment, the cap layer 36 is a double-layered structure composed of a bottom layer 34 and a top layer 34. The bottom layer 34 may be a nitride layer and the top layer 34 may be an oxide layer, but not limited thereto.

In the above paragraphs, a gate-last for high-k first process is used. However, the present embodiment may also adopt a gate-last for high-k last process. In this case, the gate dielectric layer is a gate dielectric layer having a high dielectric constant, which may be the group selected from hafnium oxide ($HfO_2$), hafnium silicate ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate ($SrTiO_3$), zirconium silicate ($ZrSiO_4$), hafnium zirconate ($HfZrO_4$), strontium bismuth tantalate ($SrBi_2Ta_2O_9$, SBT), lead zirconate titanate ($PbZr_xTi_{1-x}O_3$, PZT) and barium strontium titanate ($BaxSr_{1-x}TiO_3$, BST), but it is not limited thereto. Additionally, a barrier layer (not shown) may be formed on the gate dielectric layer to serve as an etching stop layer to protect the gate dielectric layer during the removal of the sacrificial electrode layer 32 and to prevent above disposed metals from diffusing downwards to the gate dielectric layer and from polluting the gate dielectric layer. The barrier layer (not shown) may be a single layer structure or a multilayer structure composed of tantalum nitride (TaN) or titanium nitride (TiN) etc.

Figure 3:
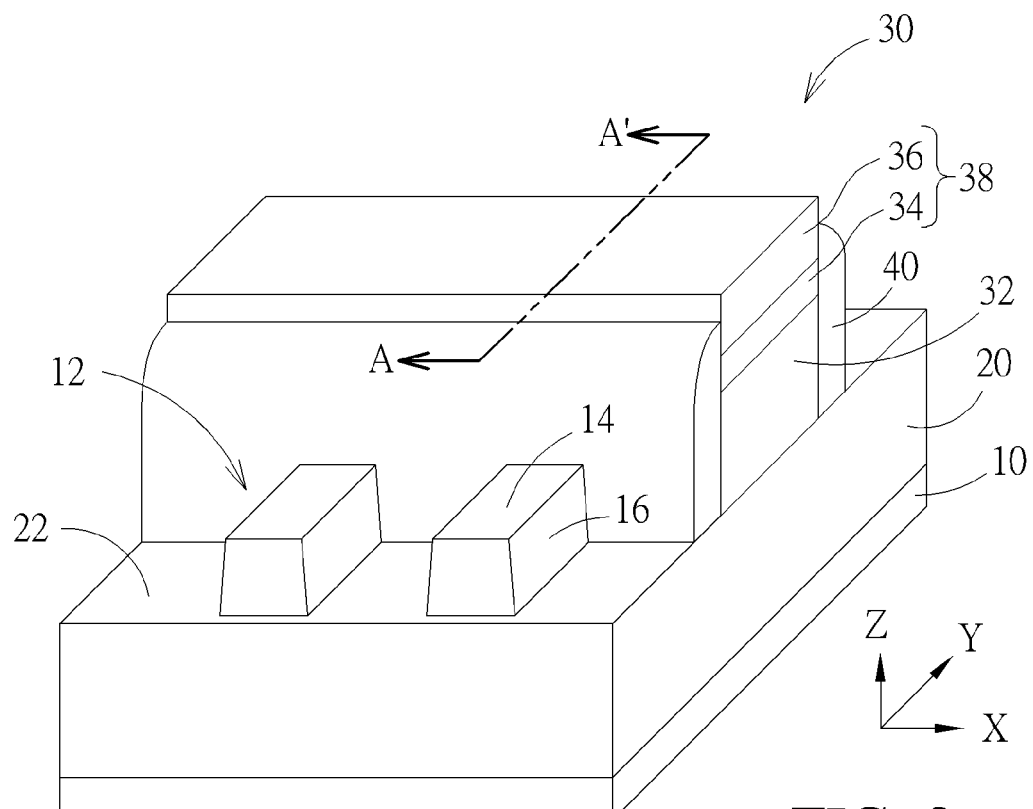
Figure 4:
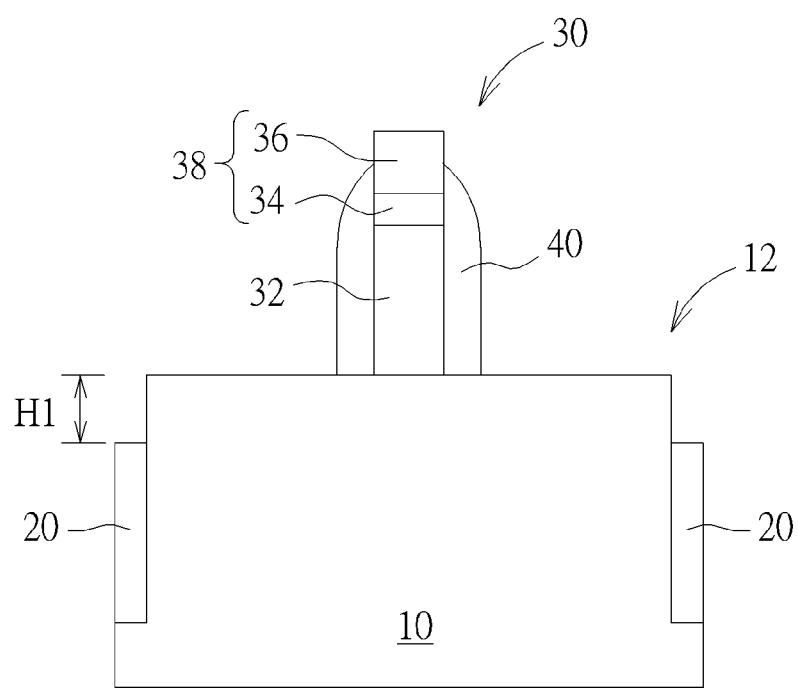

Please refer to FIG. 3 and FIG. 4, wherein FIG. 4 is a schematic cross-sectional diagram taken along a line A-A' in FIG. 3. After the formation of the gate structure, a spacer 40 is formed on the sidewalls of the gate structure 30 to define the position of an epitaxial structure. In this embodiment, the spacers 40 are respectively formed on each side of the gate structure 30 and cover portions of the top surface 22 of the isolation structure 20. More precisely, the method for forming the spacers 40 may include the following steps. A material layer is deposited on the gate structure 30 and the substrate 10, and then an etching process is performed to form the spacers 40. The spacers 40 may be a single-layered structure, such as a silicon nitride layer or a silicon oxynitride layer, or a double-layered structure, such as a silicon oxide/silicon nitride layer, but not limited thereto. In this embodiment, the spacers 40 represent spacers for defining and forming an epitaxial structure, so that other spacers may be formed before/after the spacers 40 are formed to form a lightly doped source/drain region (as shown) or a source/drain region (as shown). For simplifying and clarifying the present invention, FIG. 3 to FIG. 11 only depict the spacers 40 for forming the epitaxial structure.

Figure 5:
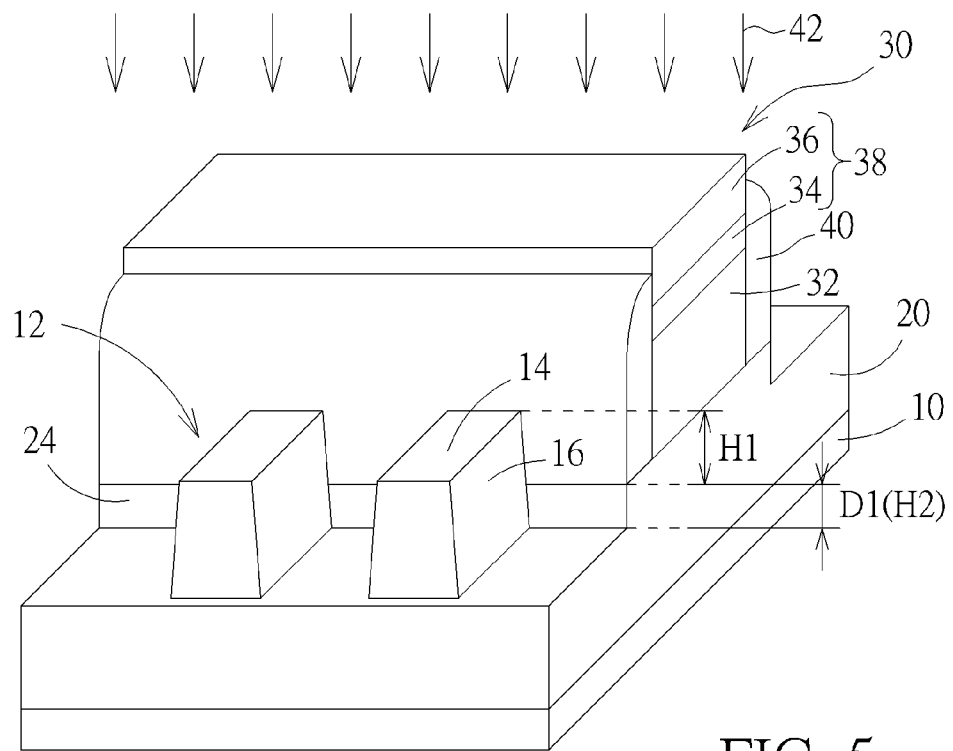

Please refer to FIG. 5. FIG. 5 is a schematic perspective view showing the semiconductor device after etching the isolation structure. After the formation of the spacers 40, the isolation structure 20 exposed from the gate structure 30 and the spacers 40 may be further etched by a suitable etching process. In this way, a top surface 22 of portions of the isolation structure 20 may be etched down to a predetermined depth (also called a first depth D1) and a structure shown in FIG. 5 is obtained. More precisely, a first etching process 42, such as a wet etching or a dry etching process, may be carried out to selectively remove the isolation structure 20 rather than the gate structure 30 and the fin structures 12. Through this process, not only portions of the sidewalls of the isolation structure 20 that are disposed under gate structure 30 and the spacers 40 may be exposed, but also portions of the fin structures 12 originally embedded in and in direct contact with the isolation structure 20 are exposed. At this time, the isolation structure 20 under the gate structure 30 and the spacers 40 may have a relatively high first top surface 22a, while the isolation structure 20 exposed from the gate structure 30 may have a relatively low second top surface 22b. There is a height difference H2 between the first top surface 22a and the second top surface 22b. For example, the height difference H2 may range from 100 Angstroms' to 250 Angstroms, preferably 150 Angstroms, but not limited thereto.

Figure 6:
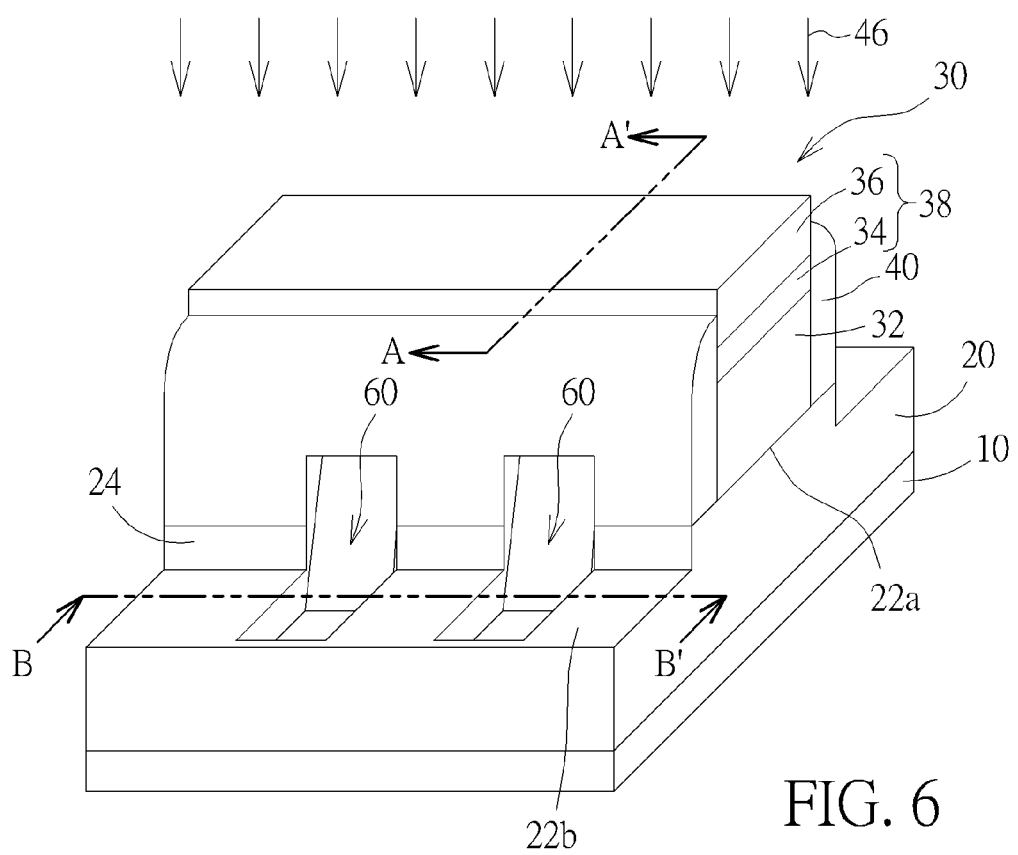
Figure 7:
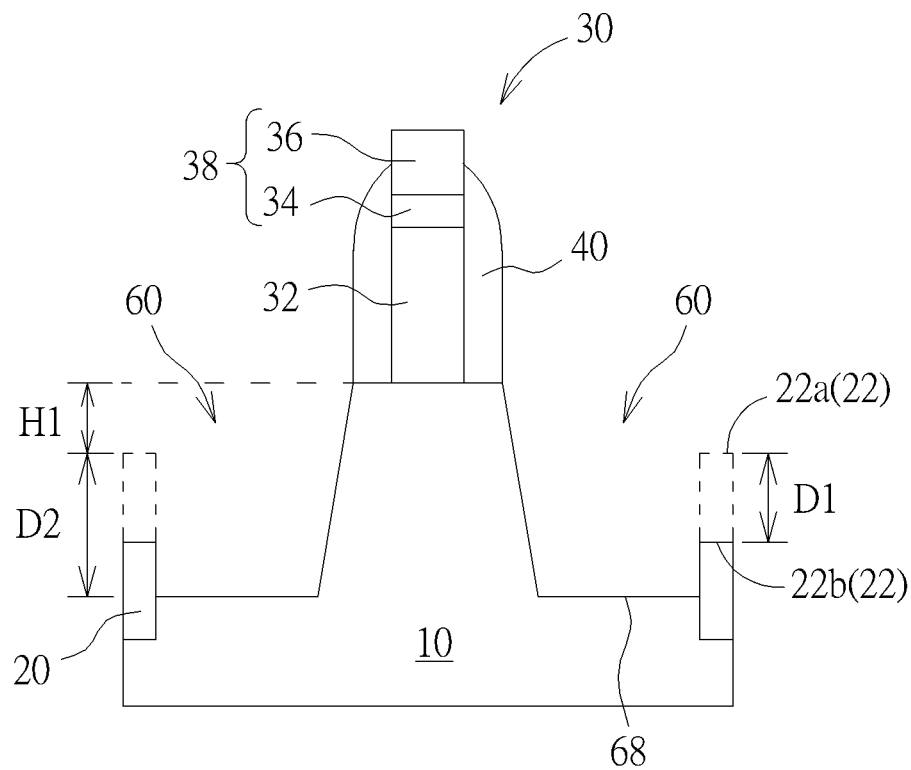
Figure 8:
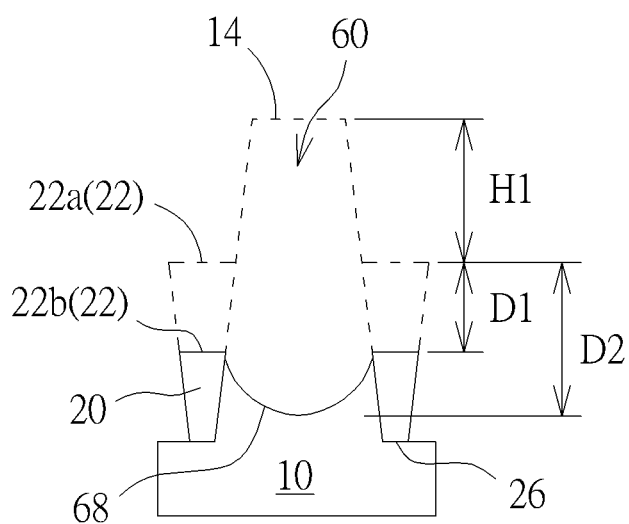

Please refer to FIG. 6 to FIG. 8. FIG. 6 is a schematic perspective view showing the semiconductor device after etching fin structures. FIG. 7 is a schematic cross-sectional diagram taken along a line A-A' in FIG. 6. FIG. 8 is a schematic cross-sectional diagram taken along a line B-B' in FIG. 6. As shown in FIG. 6 to FIG. 8, a second etching process 46 is carried out to etch the fin structures 12 under the gate structure 30 and the spacers 40. After the etching process, a recess 60 may be formed in each fin structure 12 at at least one side of the gate structure 30. Furthermore, according to this embodiment, the ends of the fin structures 12 at two sides of the gate structure 30 may respectively have a recess 60, and a bottom surface 68 of the recess 60 is preferably shallower than a bottom surface 26 of the isolation structure 20. More precisely, as shown in FIG. 7 and FIG. 8, there is a difference between the bottom surfaces 62 of the recesses 60 and the top surface 14 of the original fin structure 12, which height is equal to the first height H1 plus the second depth D2. During the second etching process 46, the top surface 22 of the isolation structure 20 at both sides of the gate structure 30 is also recessed down to a predetermined depth. This diminished value is equal to a first depth D1. Preferably, the second depth D2 is greater (also called deeper) than the first depth D1.

Furthermore, the above etching process may include at least a dry etching step and/or at least a wet etching step. For example, the substrate 10 may be etched down to a predetermined depth through a dry etching step and then may be laterally etched to form a desired profile of the recess 60 through a wet etching step, but is not limited thereto. In this embodiment, the recess 60 has an upwardly-curved cross-sectional profile, but is not limited thereto, as the cross-sectional profile of the recess depends upon the specific requirements. Additionally, a wet cleaning process (not shown) may be performed optionally to clean the surface of the recess 60 after the etching. The wet cleaning process may include a dilute hydrofluoric acid (DHF) containing process, but it is not limited thereto.

It should be noted that, the timing for etching the isolation structure 20 exposed from the gate structure 30 and the spacers 40 and the timing for etching the fin structures 12 may be reversed. More precisely, according to the present embodiment, the fin structures 12 exposed from the gate structure 30 and the spacers 40 may be etched first and the isolation structure 20 not covered by the gate structure 30 and the spacers 40 are etched thereafter. In other words, one feature of the present invention is that, through etching the isolation structure 20, the height difference between the bottom surface 68 of each recess 60 and the top surfaces 22 of the isolation structure 20 at both sides of the gate structure 30 can be reduced. Therefore, the removal of the isolation structure 20 and the formation of the recess 60 may be carried out in either sequence and both can meet the needs of the present invention.

Figure 9:
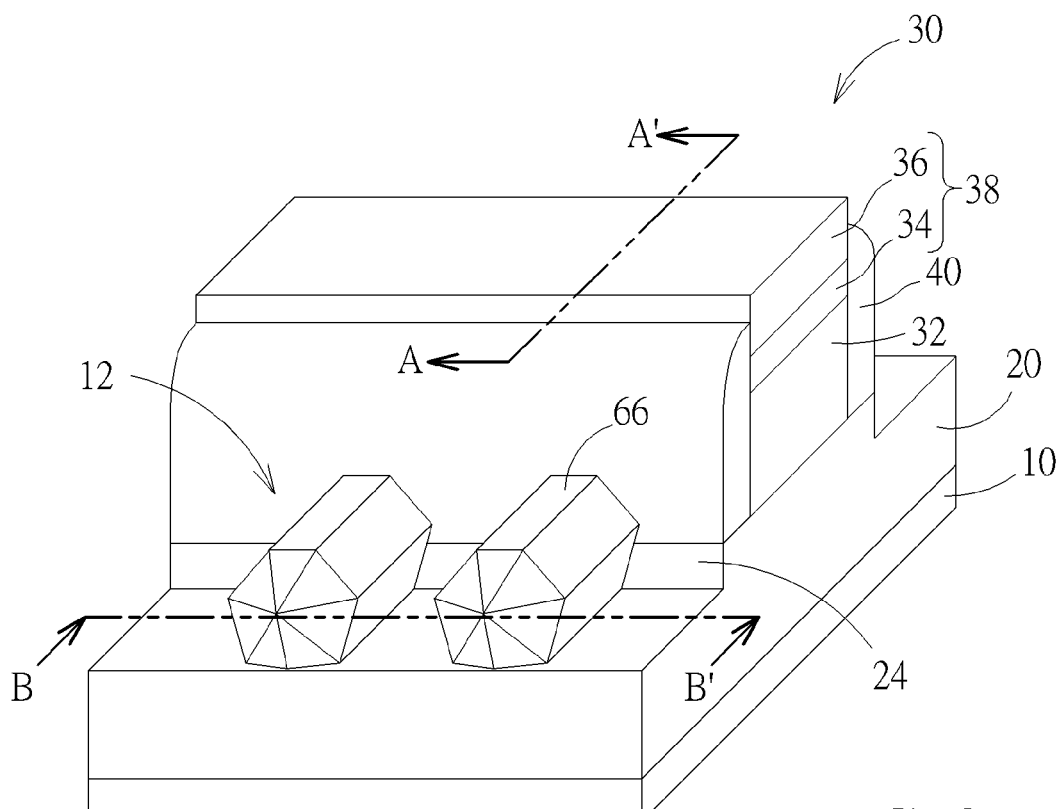
Figure 10:
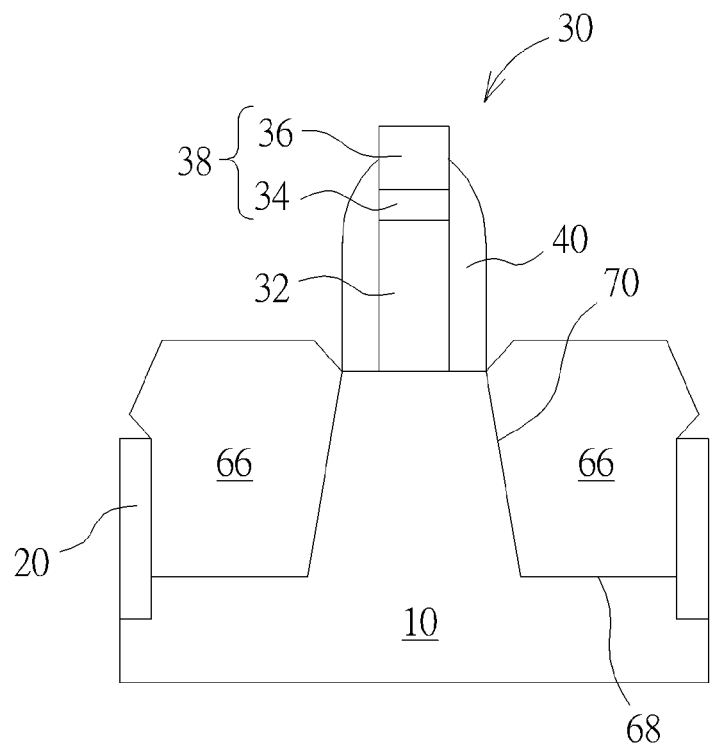
Figure 11:
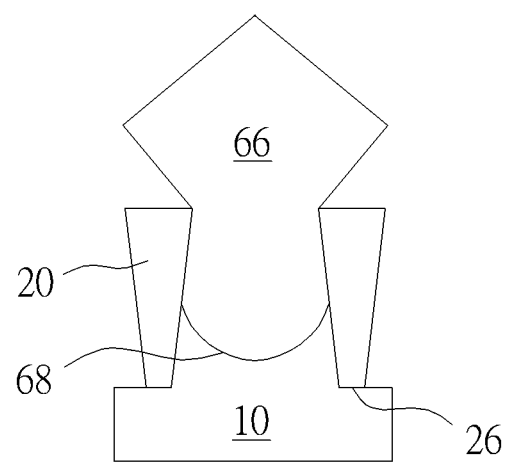

Please refer to FIG. 9 to FIG. 11. FIG. 9 is a schematic perspective view showing the semiconductor device after the formation of an epitaxial layer. FIG. 10 is a schematic cross-sectional diagram taken along a line A-A' in FIG. 9. FIG. 11 is a schematic cross-sectional diagram taken along a line B-B' in FIG. 9. As shown in FIG. 9 to FIG. 11, an epitaxial growth process, such as a molecular beam epitaxy (MBE) process, a co-flow epitaxial growth process, a cyclic selective epitaxial growth process or the likes, maybe carried out in order to grow an epitaxial structure 60 in each corresponding recess 60. More precisely, each epitaxial structure 66 may completely cover the bottom surface 68 and sidewalls 70 of the corresponding recess 60. Furthermore, the composition of the epitaxial structure 66 may be correspondingly modified according to the conductivity types of the semiconductor devices. In this way, a certain stress may be imposed on the channel regions adjacent to the top surface 14 and the two sides of the fin structure 12. For example, in a P-type semiconductor device, the epitaxial structure 66 may be doped or un-doped silicon germanium layer so as to apply a compressive stress to the channel regions. Besides, the epitaxial structure 66 may include a multilayer or a surrounded structure with a different germanium concentration gradually varying from the inside to the outside or/and from bottom to top. For example, the epitaxial layer 66 may include epitaxial Si, at least a layer of epitaxial SiGe with a relatively low concentration of Ge, at least a layer of epitaxial SiGe with a relatively high concentration of Ge, an epitaxial Si layer and so forth, which are disposed sequentially from bottom to up. In another case, in an N-type semiconductor device, the composition of the epitaxial structure 66 may include silicon phosphorous (SiP), silicon carbide (SiC), phosphorus-doped silicon carbide or the likes, so as to provide a tensile stress to the channel regions.

Furthermore, regardless of the composition of the epitaxial structure 66, since the height difference between the bottom surface 68 of each recess 60 and the top surface 22b of the isolation structure 20 at two sides of the gate structure 30 has been reduced in the above processes, the epitaxial structure 66 may not be sealed during the following epitaxial growth process and the void defects maybe avoided as a result. In other words, one feature of the present invention is that, through etching the isolation structure 20 at two sides of the gate structure 30, the epitaxial structure 66 may be formed with a desired height (also called depth) and without any void defects. Accordingly, the epitaxial structure may apply the required stress to the channel regions thereby increasing the carrier mobility of the semiconductor device.

After the formation of the above epitaxial structures, the following semiconductor processes maybe optionally carried out. For example, a high-k last replacement metal gate (RMG) process may be carried out so that the gate structure composed of polysilicon inside may be replaced with a metal gate structure. The RMG process may include the following processes: (1) depositing an interlayer dielectric to surround the gate structure; (2) removing the gate structure to leave a trench; (3) forming a gate dielectric layer to conformally cover the sidewalls and bottom of the trench; and (4) forming a conductive layer to fill up the trench. Afterwards, a contact formation process may be carried out to form a contact electrically connecting the epitaxial structure. Since the RMG process and the contact formation process are well-known to those skilled in the art, the detailed description of these is therefore omitted for the sake of clarity.

In the following paragraph, a modified embodiment of the above embodiment is disclosed and the description below is mainly focused on differences among each embodiment. In addition, like or similar features will usually be described with same reference numerals for ease of illustration and description thereof.

Please refer to FIG. 3 and FIG. 5. According to this modified embodiment, after the formation of the spacers, the first etching process is also carried out to expose not only portions of the sidewalls of the isolation structure 20 disposed under the gate structure 30 and the spacers 40, but also to expose portions of the fin structures 12 originally embedded in and in direct contact with the isolation structure 20. Afterwards, with a slight difference from the process described in the above embodiment, the second etching process is not carried out in this modified embodiment so that no recess is formed in the fin structures. Finally, similarly to the structure shown in FIG. 9, the epitaxial growth process is carried out to form the epitaxial structure 66 on the surface of the fin structure. The following processes are all similar to those described in the previous embodiment, the detailed description of which is therefore omitted for the sake of clarity. In this modified embodiment, since portions of the isolation structure 20 are removed, the epitaxial structure 66 may effectively apply stress to the corresponding channel regions.

It should be noted that, for the sake of clarity, only the non-planar FETs are described in the above paragraphs. However, planar FETs may also be formed without departing from the scope and spirit of the present invention. More precisely, in this case, the gate structure may be formed to cover a planar active region and portions of the isolation structures. Then, the active region and the isolation structure at two sides of the gate structure are etched sequentially. Finally, an epitaxial growth process is carried out. Similarly, through etching the isolation structure at two sides of the gate structure, the epitaxial structure may be formed with a desired height (also called depth) without void defects. Accordingly, the epitaxial structure may apply the required stress to the channel regions thereby increasing the carrier mobility of the semiconductor device.

To summarize, the present invention provides a semiconductor device. By performing the process for etching the isolation structure and associated with an optional recess, the difference in height between the bottom surface of the recess and the top surface of the isolation structure at two sides of the gate structure may be reduced. In this way, the epitaxial structure may not be sealed during the following epitaxial growth process and the void defects may be avoided. Accordingly, the epitaxial structure may apply a required stress to the channel regions and increase the carrier mobility of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin structure, protruding from a surface of a substrate, wherein the fin structure comprises a top surface and two side surfaces;
   an isolation structure, disposed on the surface of the substrate and surrounding the fin structure;
   a gate structure, overlaying the top surface and the two side surfaces of a portion of the fin structure and covering a portion of the isolation structure, wherein the isolation structure under the gate structure has a first top surface and the isolation structure at two sides of the gate structure has a second top surface, and the first top surface is higher than the second top surface; and
   an epitaxial layer, disposed at one side of the gate structure and in direct contact with the fin structure.

2. The semiconductor device according to claim 1, wherein there is a height difference between the first top surface and second top surface, and the height difference ranges from 100 Angstroms to 250 Angstroms.

3. The semiconductor device according to claim 1, wherein the gate structure is a metal gate structure.

4. The semiconductor device according to claim 1, wherein the isolation structure under the gate structure comprises a sidewall and the epitaxial structure is in direct contact with the sidewall.

5. The semiconductor device according to claim 1, further comprising a recess formed at one end of the fin structure, wherein the epitaxial structure fills up the recess.

6. The semiconductor device according to claim 5, wherein a bottom surface of the epitaxial structure is shallower than a bottom surface of the isolation structure.

7. The semiconductor device according to claim 6, wherein there is a height difference between the bottom surface of the epitaxial structure and the bottom surface of the isolation structure, and the height difference ranges from 100 Angstroms to 250 Angstroms.

8. The semiconductor device according to claim 1, wherein the epitaxial structure comprises silicon germanium, silicon phosphide or phosphor-doped silicon carbide.

9. The semiconductor device according to claim 1, further comprising a spacer disposed on a sidewall of the gate structure.

10. The semiconductor device according to claim 1, further comprising:
    another epitaxial structure, disposed at another side of the gate structure and in direct contact with the fin structure; and
    a channel region, contiguous to the top surface and the side surfaces of the fin structure, and between the epitaxial structure and said another epitaxial structure.

* * * * *